United States Patent [19]
Conti

[11] Patent Number: 5,931,513
[45] Date of Patent: Aug. 3, 1999

[54] HOUSING ASSEMBLY INCLUDING A LATCH MECHANISM AND A SELECTIVE CALL RECEIVER

[75] Inventor: Brian V. Conti, Lake Worth, Fla.

[73] Assignee: Motorola, Schaumburg, Ill.

[21] Appl. No.: 08/954,653

[22] Filed: Oct. 20, 1997

[51] Int. Cl.$^6$ ...................................................... H05K 5/00
[52] U.S. Cl. ...................... 292/87; 292/91; 292/DIG. 38; 220/324; 429/100
[58] Field of Search .............................. 292/152, 80, 84, 292/87, 89, 91, 107, 114, 125, DIG. 11, DIG. 17, DIG. 53, 10, 11, 13, 17, 20, DIG. 38; 16/231, 232, 319, 332, 335, 364, DIG. 13; 220/4.02, 324, 326, 331, 522; 455/90; 429/97, 99, 100

[56] References Cited

U.S. PATENT DOCUMENTS

| | | | |
|---|---|---|---|
| 3,681,596 | 8/1972 | Taylor | 292/17 |
| 4,212,415 | 7/1980 | Neely | 220/324 |
| 4,662,664 | 5/1987 | Wendt | 292/19 |
| 5,060,990 | 10/1991 | Smith | 292/91 |
| 5,244,755 | 9/1993 | Benoist | 429/97 |
| 5,508,124 | 4/1996 | Gordecki | 429/97 |
| 5,551,589 | 9/1996 | Nakamura | 220/326 |
| 5,613,237 | 3/1997 | Bent | 455/351 |
| 5,761,768 | 6/1998 | Wolf | 16/225 |
| 5,793,619 | 8/1998 | Deguchi | 455/90 |

Primary Examiner—Darnell M. Boucher
Assistant Examiner—Gary Estremsky
Attorney, Agent, or Firm—Eduardo Guntin

[57] ABSTRACT

A housing assembly includes a housing (100) and a door (102). The housing has a first opening (115) and includes a selective call receiver (200). The door is coupled to the housing for gaining access to the selective call receiver by way of the first opening. The door is slidable between first and second positions with the housing, wherein the first position the door is latched, and wherein the second position the door is unlatched and pivots to gain access to the first opening. The door includes a plurality of springless latches (107), wherein each springless latch comprises at least two arms (106), each arm having an external detent (108), and an internal detent (110). Additionally, the housing includes a corresponding snap post (112) for latching to a corresponding springless latch in the first position.

11 Claims, 4 Drawing Sheets

HOUSING ASSEMBLY INCLUDING A LATCH MECHANISM AND A SELECTIVE CALL RECEIVER

FIELD OF THE INVENTION

This invention relates in general to housing assemblies, and particularly, to a housing assembly including a latch mechanism and a selective call receiver.

BACKGROUND OF THE INVENTION

Portable communication devices are commonly energized by a battery placed within the housing of the device. To provide access to the battery, an opening is provided in the housing with a door for gaining access to the battery compartment. Generally, for portable communication devices, such as pagers, the housing is composed of conventional plastic material that is rugged enough to be subjected to rough usage. An important aspect in the design of the housing assembly of a portable communication device is the use of a latching mechanism to prevent accidental opening of the battery door during encounters that subjects the housing to severe physical shock.

Although strong door latches are well known, they have not been entirely satisfactory. In some cases, prior art latches have been objectionably large requiring a number of parts resulting in excess manufacturing costs and complexity in assembly. Accordingly, what is needed is a housing assembly that overcomes the foregoing disadvantages described in the prior art.

BRIEF DESCRIPTION OF THE DRAWINGS

The present invention is pointed out with particularity in the appended claims. However, other features of the invention will become more apparent and best understood by referring to the following detailed description in conjunction with the accompanying drawings in which:

DESCRIPTION OF THE PREFERRED EMBODIMENT

Figure 1:
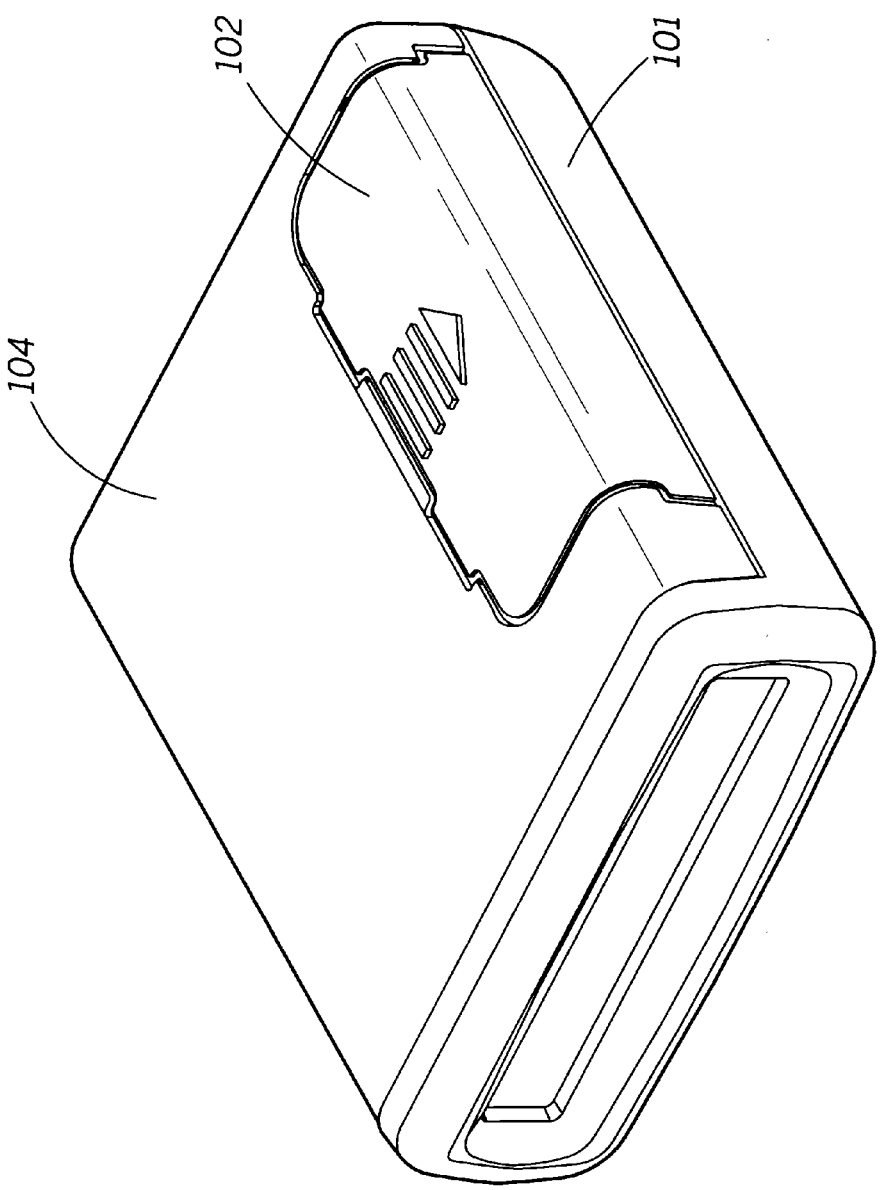
FIG. 1 shows a housing assembly including a housing having front and back covers with a door coupled to the back cover according to the present invention.
Figure 2:
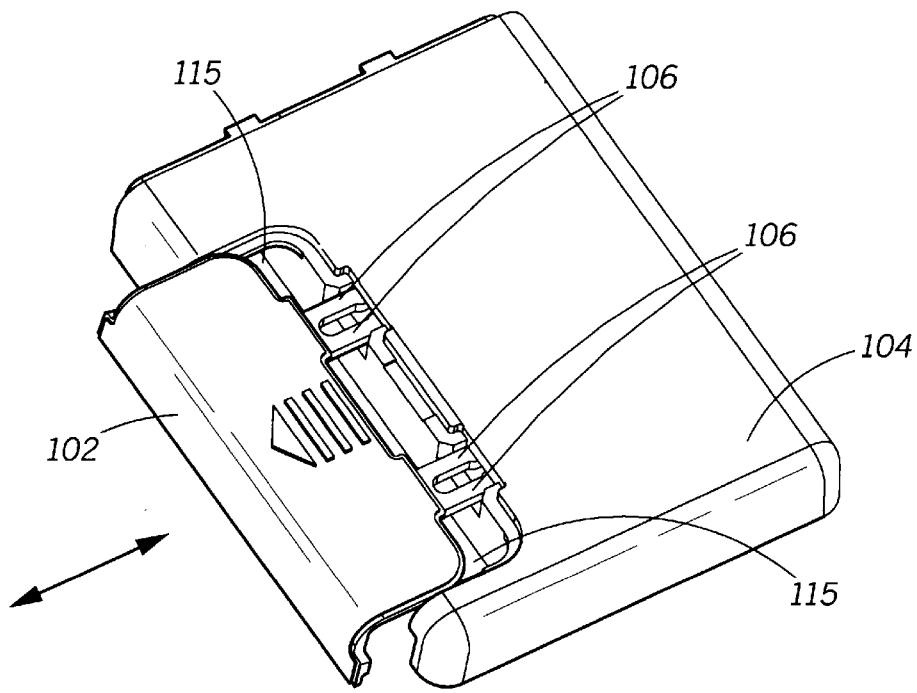
FIG. 2 shows an outer view of the back cover during removal of the door according to the present invention.
Figure 5:
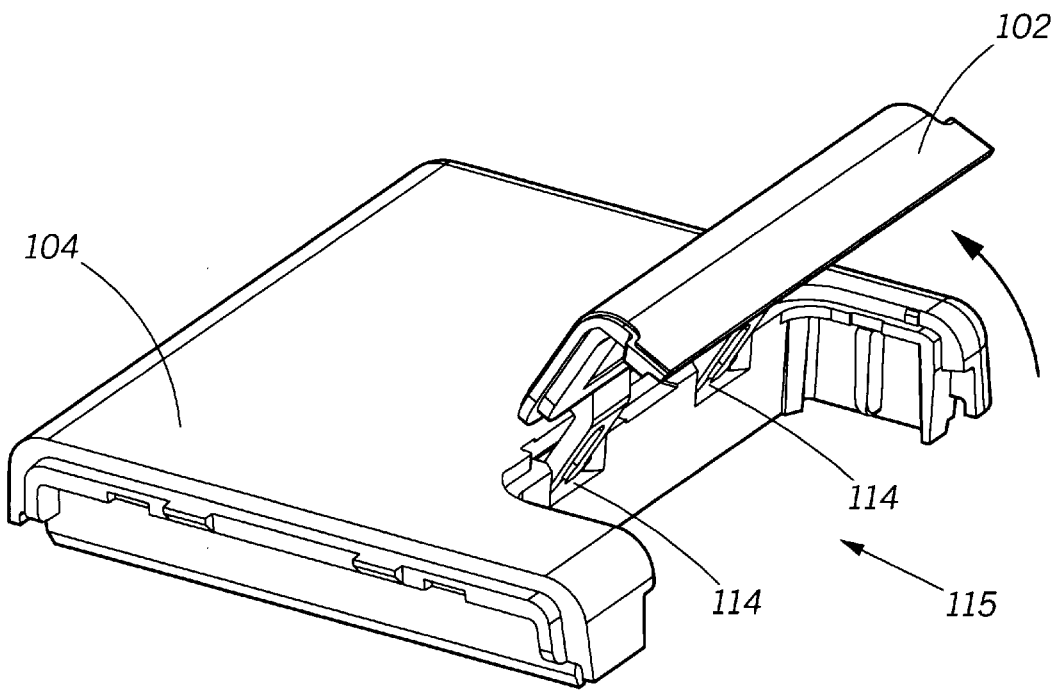
FIG. 5 shows the pivoting action of the door with respect to the back cover according to the present invention.

FIG. 1 shows a housing assembly including a housing 100 having front and back covers 101, 104 with a door 102 coupled to the back cover 104 according to the present invention. The housing 100 has a first opening 115 (a cavity shown in FIGS. 2 and 5) that allows the door 102 to be linearly slidable between first and second positions with the housing 100. FIG. 1 shows the door 102 in the first position, which is representative of the door 102 being latched to the housing 100. In the latched position the door 102 is substantially planar with contouring surfaces of the back cover 104. FIG. 2 shows the door 102 in the second position, which is representative of the door 102 being unlatched from the housing 100. In the unlatched position the door 102 extends linearly away from the back cover 104 and can be pivoted at a substantial angle to gain access to the first opening 115 (see FIG. 5).

Figure 3:
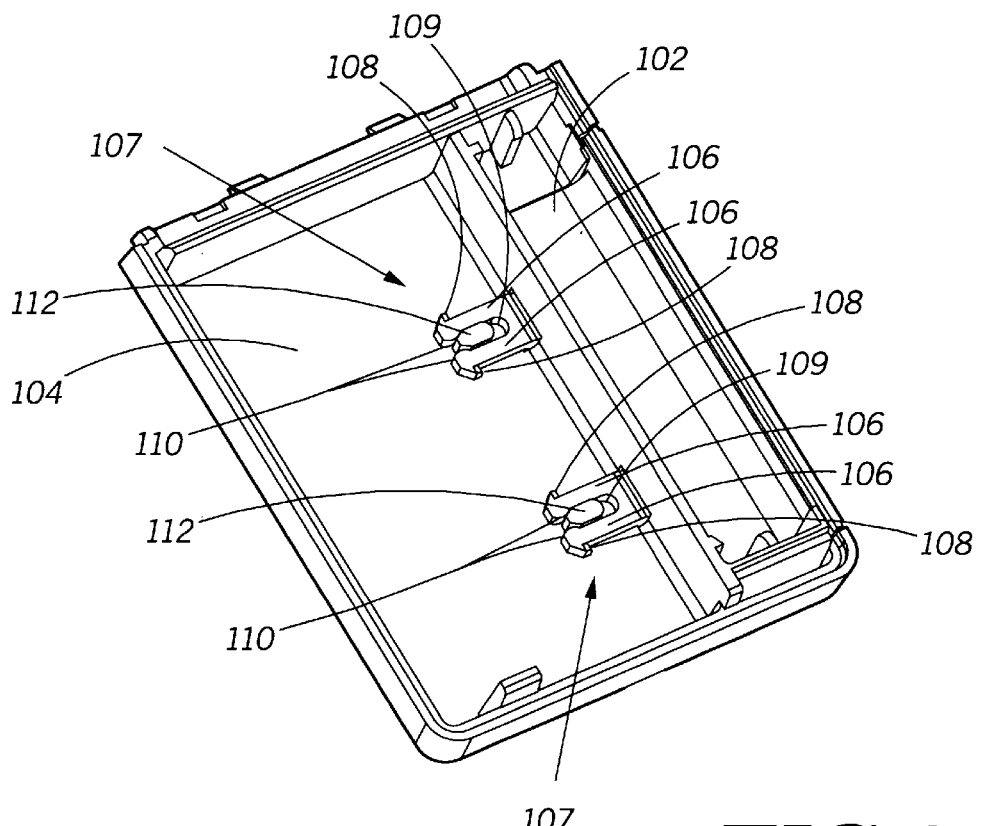
FIG. 3 shows an inner view of the back cover and door coupled thereto according to the present invention.
Figure 4:
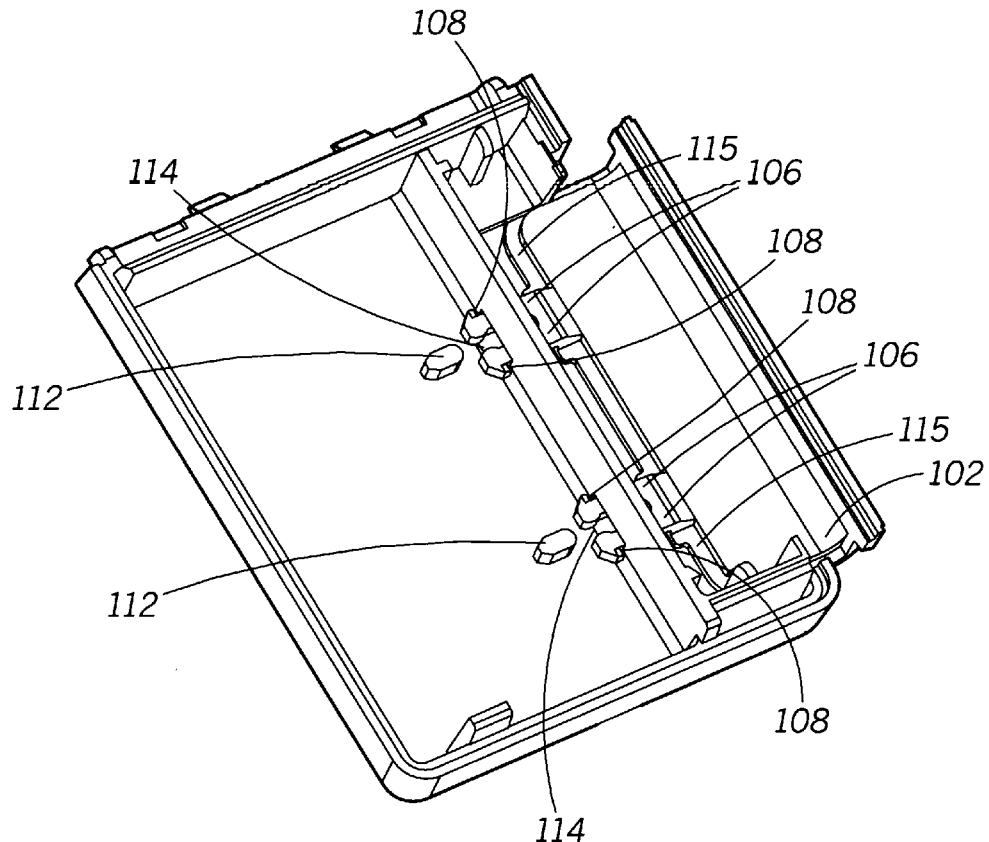
FIG. 4 shows the effect that the springless latches have on the door during its removal from the back cover according to the present invention.

FIGS. 3 and 4 illustrate the latching elements of the door 102 and the back cover 104. As shown in FIG. 3, the door 102 comprises a plurality of springless latches 107, each comprising at least two arms 106, each arm 106 having an external detent 108, and an internal detent 110. Additionally, for each springless latch 107 there is a corresponding snap post 112 coupled to the housing 100 (shown in the inside portion of the back cover 104). The internal detent 110 of each arm 106 engages with the corresponding snap post 112 for latching the door 102 in the first position (the closed position). Engagement is accomplished by linearly sliding the door 102 towards the back cover 104 until the contours of the door 102 and the back cover 104 are substantially planar to each other, thereby forming a seemingly continuous surface.

Prior to engagement, each springless latch 107 is decoupled from its corresponding snap post 112 as shown in FIG. 4. The u-shaped contour 109 of each springless latch 107 is made to allow slidable entry with the snap post 112. However, because the internal detents 110 initially create an obstruction during engagement of with the snap post 112, a threshold force is necessary to deflect the internal detents 110, thereby allowing entry of the snap post 112 into the u-shaped contour 109. Once the snap post 112 has been secured by the springless latch 107, the internal detents 110 prevent the door 102 from linearly sliding in a direction away from the back cover 104 (see FIG. 3). The threshold force for engaging the snap posts 112 with the springless latches 107 is dependent on the tension force of each arm 106 of the springless latch 107. This force varies depending on the composition of the housing structure.

FIG. 4 shows the effect that the springless latches 107 have on the door 102 during its removal from the back cover 104 according to the present invention. Referring back to FIG. 3, it should be evident that to linearly slide the door 102 from the closed position to the open position, the same threshold force used for sliding the door 102 into the closed position must be used to open the door 102. This equal, but opposite force, helps to deflect the internal detents 110 for disengagement of the springless latch 107 from the snap post 112 as shown in FIG. 4.

However, to prevent the door from being completely decoupled from the back cover 104, the back cover 104 includes a plurality of openings 114 that are orthogonal to the first opening 115. Each of the orthogonal openings 114 has a geometry adequate for capturing a corresponding springless latch 107, and for allowing, in the second position (i.e., the open position), pivoting of the door 102 and the housing 100 to gain access to the first opening 115.

As noted earlier, the springless latches 107 include external detents 108. These detents 108 provide a tension force that substantially prevents removal of the springless latches 107 once captured by the orthogonal openings 114. Only when forces greater than the tension force of the external detents 108 is applied to the housing 100 and the door 102 in substantially opposite directions can the door 102 be removed from the orthogonal openings 114. Application of these forces essentially causes the arms 106 to collapse inwards so as to allow the springless latch 107 to penetrate the orthogonal opening 114 for complete removal of the door 102. As shown in FIGS. 3 and 4, the snap posts 112 are contiguous with the back cover 104, and the springless latches are contiguous with the door 102.

The features of the present invention just described allow opening of the door 102 for gaining access into the housing 100 without having to completely decouple the door 102 from the housing 100. This feature is advantageous over the prior art in that it prevents users of the housing 100 from inadvertently misplacing or losing the door 102 while attempting to gain access into the cavity of the housing 100 (e.g., during the process of replacing a battery for a selective call receiver such as, for example, a pager). Additionally, the present invention allows for complete removal of the door 102 with minimal effort for servicing or replacement of the door 102. Because there are no independent components for the latch mechanism, manufacturing costs and serviceability are substantially improved over latching mechanisms used by prior art housing assemblies.

Figure 6:
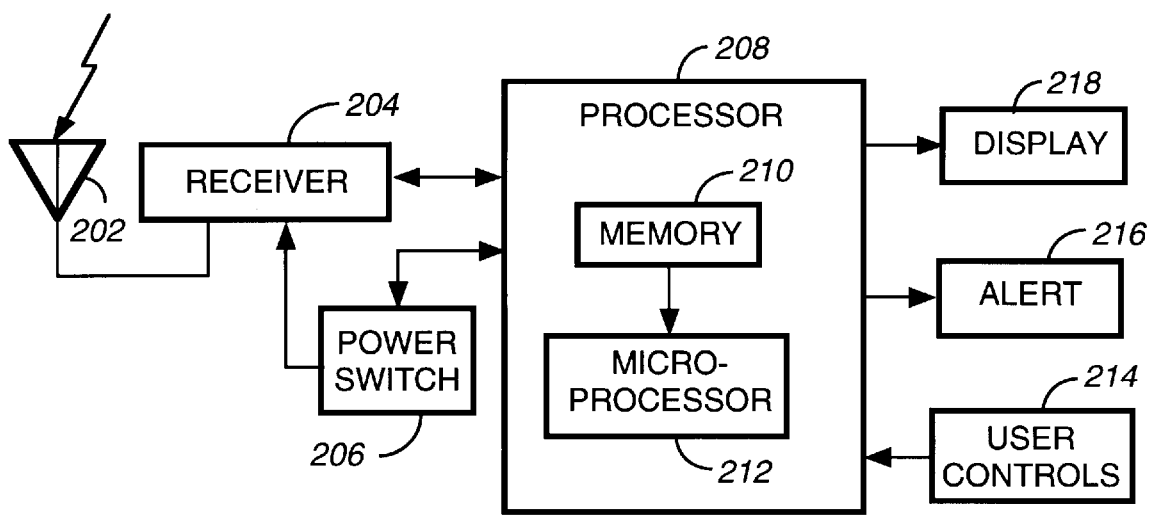
FIG. 6 shows an electrical block diagram of a selective call receiver included in the housing according to the present invention.

FIG. 6 shows a selective call receiver (SCR) 200 included in the housing 100 of FIG. 1 according to the present invention. The SCR 200 comprises an antenna 202 for intercepting RF signals from, for example, a radio communication system (not shown). The antenna 202 is coupled to a receiver 204 employing conventional demodulation techniques for receiving the communication signals transmitted by the radio communication system. Radio signals received by the receiver 204 produce demodulated information, which is coupled to a processor 208 for processing received messages. A conventional power switch 206, coupled to the processor 208, is used to control the supply of power to the receiver 204, thereby providing a battery saving function.

To perform the necessary functions of the SCR 200, the processor 208 includes a microprocessor 212, and a memory 210 including a random access memory (RAM), a read-only memory (ROM), and an electrically erasable programmable read-only memory (EEPROM). Preferably, the processor 208 is similar to the M68HC08 micro-controller manufactured by Motorola, Inc. It will be appreciated that other similar processors can be utilized for the processor 208, and that additional processors of the same or alternative type can be added as required to handle the processing requirements of the processor 208.

The processor 208 is programmed by way of the ROM to process incoming messages transmitted by the radio communication system. The processor 208 decodes an address in the demodulated data of the received message, compares the decoded address with one or more addresses stored in the EEPROM, and when a match is detected, proceeds to process the remaining portion of the message. Once the processor 208 has processed the message, it stores the message in the RAM, and a call alerting signal is generated to alert a user that a message has been received. The call alerting signal is directed to a conventional audible or tactile alerting device 216 for generating an audible or tactile call alerting signal.

The message can be accessed by the user through user controls 214, which provide functions such as lock, unlock, delete, read, etc. More specifically, by the use of appropriate functions provided by the user controls 214, the message is recovered from the RAM, and conveyed to the user by way of a display 218, e.g., a conventional liquid crystal display (LCD). It will be appreciated that, alternatively, the display 218 can be accompanied by an audio circuit (not shown) for conveying voice messages.

Although the invention has been described in terms of a preferred embodiment it will be obvious to those skilled in the art that many alterations and variations may be made without departing from the invention. Accordingly, it is intended that all such alterations and variations be considered as within the spirit and scope of the invention as defined by the appended claims.

What is claimed is:

1. A housing assembly, comprising:
a housing having a first opening; and
a door coupled to the housing,
wherein the door is slidable between first and second positions of the housing,
wherein the first position is defined by the door being in a latched position covering the first opening,
wherein the second position is defined by the door being in an unlatched position exposing the first opening, and pivotable to provide access to the first opening, and
wherein the door comprises a plurality of springless latches, wherein each springless latch comprises at least two arms, the arms having oppositely extending external detents, and each arm having an internal detent; and
wherein the housing includes a corresponding plurality of snap posts, each snap post latching to a corresponding springless latch in the first position, and wherein the second position,
the internal detents of each springless latch are disengaged from its corresponding snap post, and
each springless latch is captured by the housing by engagement of corresponding external detents to portions of the housing, thereby allowing pivoting of the door in the second position, and preventing removal of each springless latch from the housing.

2. The housing assembly as recited in claim 1, wherein the internal detent of each arm engages with its corresponding snap post for latching the door in the first position.

3. The housing assembly as recited in claim 1, the housing further comprising a plurality of openings orthogonal to the first opening, wherein each opening has a geometry adequate for capturing a corresponding springless latch, and for allowing, in the second position, pivoting of the door and the housing to provide access to the first opening.

4. The housing assembly as recited in claim 3, wherein the external detent of each arm resists a tension force applied in an opening direction once the plurality of springless latches have been captured by the plurality of openings.

5. The housing assembly as recited in claim 4, wherein the plurality of springless latches captured by the plurality of openings are removable from the plurality of openings when forces greater than the tension force are applied to the housing and the door in substantially opposite directions.

6. The housing assembly as recited in claim 1, wherein the housing comprises a front cover and a back cover having the first opening, wherein the back cover is coupled to the front cover and to the door.

7. The housing assembly as recited in claim 1, wherein the housing comprises a selective call receiver.

8. A housing assembly, comprising:
a housing including:
a first opening; and
a plurality of openings orthogonal to the first opening; and a door coupled to the housing,
wherein the door is slidable between first and second positions of the housing,
wherein the first position is defined by the door being in a latched position covering the first opening,
wherein the second position is defined by the door being in an unlatched position exposing the first opening, and pivotable to provide access to the first opening, and wherein the door comprises a plurality of springless latches, and wherein the housing includes a corresponding plurality of snap posts, each snap post latching to a corresponding springless latch in the first position, wherein each springless latch comprises at least two arms, the arms having oppositely extending external detents, and each arm having an internal detent, wherein the internal detent of each arm engages with its corresponding snap post for latching the door in the first position, and wherein each opening of the housing that is orthogonal to the first opening has a geometry adequate for capturing a corresponding springless latch, and for allowing, in the second position, pivoting of the door and the housing to provide access to the first opening, and whereby in the second position, the internal detents of each springless latch are disengaged from its corresponding snap post, and each springless latch is captured by the housing by engaging its corresponding external detents to a corresponding orthogonal opening, thereby preventing removal of each springless latch from the housing.

9. The housing assembly as recited in claim 7, wherein the housing comprises a selective call receiver.

10. A housing assembly, comprising:

a housing including:

a first opening; and a plurality of openings orthogonal to the first opening; and a door coupled to the housing, wherein the door is slidable between first and second positions of the housing, wherein the first position is defined by the door being in a latched position covering the first opening, wherein the second position is defined by the door being in an unlatched position exposing the first opening, and pivotable to provide access to the first opening, and wherein the door comprises a plurality of springless latches, and wherein the housing includes a corresponding plurality of snap posts, each snap post latching to a corresponding springless latch in the first position, wherein each springless latch comprises at least two arms, the arms having oppositely extending external detents, and each arm having an internal detent, wherein the internal detent of each arm engages with its corresponding snap post for latching the door in the first position, and wherein the external detent of each arm resists a tension force applied in an opening direction once the plurality of springless latches have been captured by the plurality of openings, and wherein each opening of the housing that is orthogonal to the first opening has a geometry adequate for capturing a corresponding springless latch, and for allowing, in the second position, pivoting of the door and the housing to provide access to the first opening, and whereby in the second position, the internal detents of each springless latch are disengaged from its corresponding snap post, and each springless latch is captured by the housing by engaging its corresponding external detents to a corresponding orthogonal opening, thereby preventing removal of each springless latch from the housing.

11. The housing assembly as recited in claim 9, wherein the housing comprises a selective call receiver.

* * * * *